United States Patent [19]
Weindelmayer et al.

[11] Patent Number: 5,392,360
[45] Date of Patent: Feb. 21, 1995

[54] METHOD AND APPARATUS FOR INSPECTION OF MATCHED SUBSTRATE HEATSINK AND HAT ASSEMBLIES

[75] Inventors: Frederick G. Weindelmayer, Manassas; Michael A. Sipe, McLean, both of Va.

[73] Assignee: International Business Machines Corporation, Armonk, N.Y.

[21] Appl. No.: 54,338

[22] Filed: Apr. 28, 1993

[51] Int. Cl.$^6$ .............................................. G06K 9/00
[52] U.S. Cl. ........................................ 382/8; 348/129; 382/48
[58] Field of Search ................... 382/8, 27, 48, 44; 364/408; 340/686; 356/392, 393, 394, 390; 348/92, 94, 129, 130

[56] References Cited
U.S. PATENT DOCUMENTS

| | | | |
|---|---|---|---|
| 3,905,018 | 9/1975 | Gray | 340/146.3 MA |
| 4,148,065 | 4/1979 | Nakagawa et al. | 358/101 |
| 4,185,298 | 1/1980 | Billet et al. | 358/106 |
| 4,213,117 | 7/1980 | Kembo et al. | 340/146.3 H |
| 4,295,198 | 10/1981 | Copeland et al. | 364/515 |
| 4,421,410 | 12/1983 | Karasaki | 356/378 |
| 4,532,650 | 7/1985 | Wihl et al. | 382/8 |
| 4,669,123 | 5/1987 | Kobayashi et al. | 382/8 |
| 4,794,647 | 12/1988 | Forgues et al. | 382/8 |
| 5,027,295 | 6/1991 | Yotsuya | 364/552 |
| 5,044,072 | 9/1991 | Blais et al. | 356/400 |
| 5,051,825 | 9/1991 | Cochran et al. | 358/106 |
| 5,058,178 | 10/1991 | Ray | 382/8 |

Primary Examiner—Joseph Mancuso
Attorney, Agent, or Firm—Heslin & Rothenberg

[57] ABSTRACT

The invention is comprised of a method and apparatus for inspecting substrates and hat sink hat assemblies to determine whether the chips on the substrate and pistons on the heatsink hat assembly are matched. The inspection is carried out by separately illuminating both the substrate and the heatsink hat assembly in such a way that a bilevel image of each assembly is created. Each assembly has an associated image-acquisition device, such as a television or video camera which captures the bilevel image. These images are then converted to an array of image points. The points of the image of the substrate assembly are compared with a preset pattern to determine whether a chip is missing. A similar comparison is done with the points of the image of the heatsink hat assembly to determine whether any piston is missing. A deviation from the expected pattern will be communicated to an operator who will take corrective action.

5 Claims, 7 Drawing Sheets

METHOD AND APPARATUS FOR INSPECTION OF MATCHED SUBSTRATE HEATSINK AND HAT ASSEMBLIES

FIELD OF INVENTION

The invention relates generally to a method and apparatus for inspecting substrates and heatsink hat assemblies. More specifically, this invention provides an improved method of determining whether the chips on a substrate assembly are matched to the pistons on a heatsink hat assembly prior to packaging the two together.

BACKGROUND OF INVENTION

FIG. 1 is a perspective drawing of a substrate assembly (1) with six chips (10,11,12,13,14,15) and a heatsink hat assembly (2) with space for six pistons, five of which spaces are populated (3, 4,5,6,7) and one of which is missing a piston (8). Each piston is spring loaded.

During packaging, a substrate and a heatsink hat assembly are bonded together. More particularly, each piston is seated on a chip in order to provide heat dissipation through the hat assembly. It is critical that each chip in the array have a corresponding piston on the heatsink. If a piston is missing (as for example, in FIG. 1, 8), the matching chip (15) will have no way of dissipating heat and would fail (thermal breakdown). Conversely, it is critical that each piston have a corresponding chip. A piston lodged against an empty chip socket could cause a short between contacts on the chip socket. Thus, any mismatch results in a chip defect and (potentially) either a required scrapping of the entire assembly or expensive rework.

In prior art, the piston and chip were matched visually by the operator. If a chip was not present on the substrate assembly, the operator would manually remove the corresponding piston and spring. The visual matching operation was prone to human error and often resulted in the destruction of extremely expensive components.

OBJECTS OF THE INVENTION

It is accordingly an object of the invention to develop an improved method and apparatus of determining whether the chips on a substrate assembly are matched to the pistons on a heatsink hat assembly prior to packaging the two together.

It is a further object of the invention to develop an improved method and apparatus which can eliminate the errors that resulted from attempting to visually match a piston and chip in substrate and hat heatsink assembly.

It is a further object of this invention to develop an method and apparatus by which mismatches between chips and pistons are performed automatically by computer program with sufficient accuracy to ensure that expensive destruction of components can be avoided.

BRIEF DESCRIPTION OF THE INVENTION

This invention provides a method and apparatus for inspecting substrates and heatsink hat assemblies to determine whether the chips on the substrate and pistons on the heatsink hat assembly are matched.

The inspection is carried out by separately illuminating both the substrate and the heatsink hat assembly in such a way that a bilevel image of each assembly is created. Each assembly has an associated image-acquisition device, such as a television or video camera which captures the bilevel image. These images are then converted to an array of image points. The points of the image of the substrate assembly are compared with a preset pattern to determine whether a chip is missing. A similar comparison is done with the points of the image of the heatsink hat assembly to determine whether any piston is missing. A deviation from the expected pattern will be communicated to an operator who will take corrective action.

BRIEF DESCRIPTION OF THE DRAWINGS

FIG. 3A illustrates the arrangement of the light source and the substrate assembly. FIG. 3B illustrates the arrangement of the light source and heatsink assembly of the heatsink hat assembly.

DETAILED DESCRIPTION OF THE INVENTION

Figure 2:
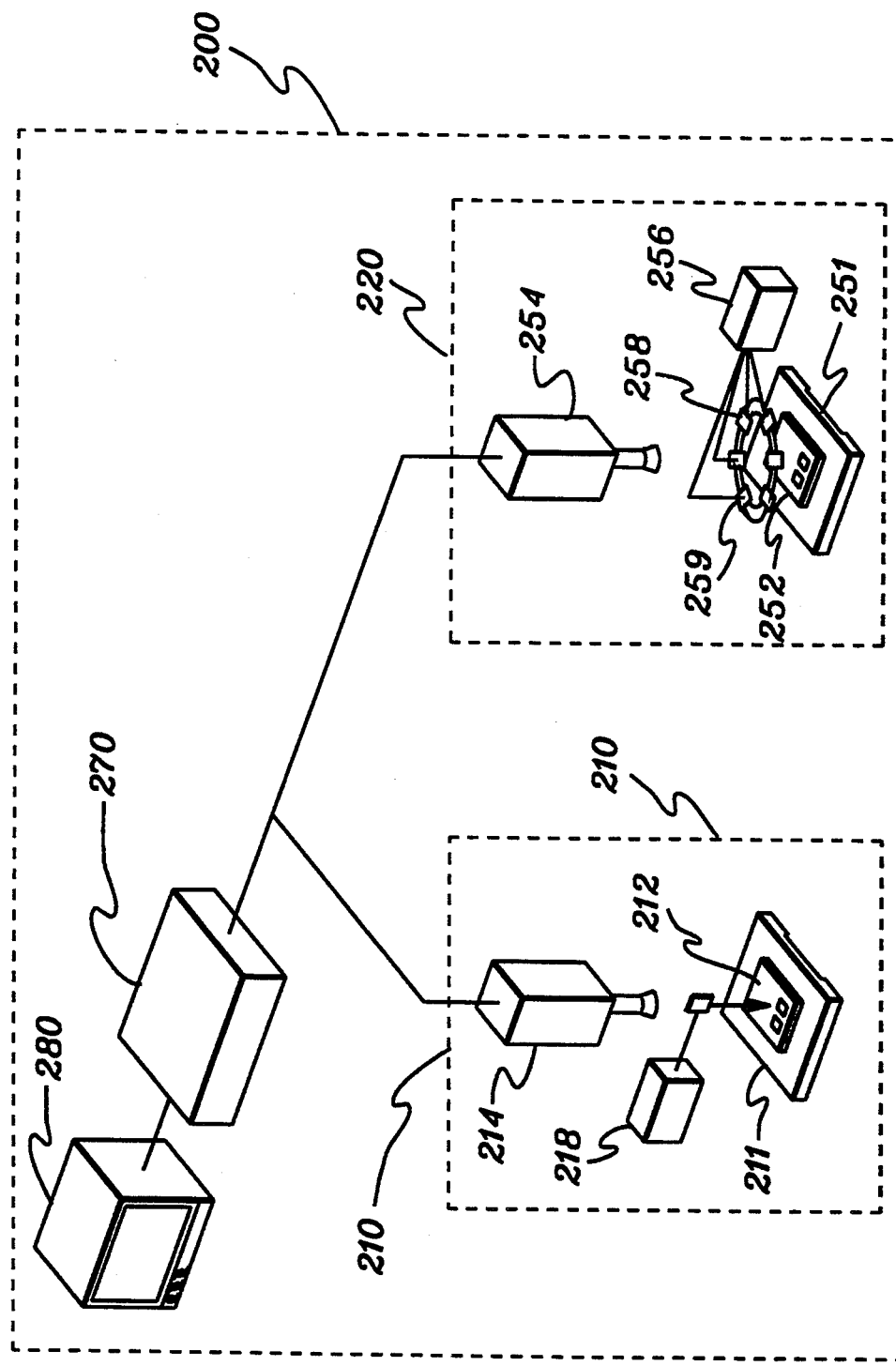
FIG. 2 is a schematic illustration of a system, in accordance with the invention, of determining mismatches between pistons and chips.

FIG. 2 shows a system 200, in accordance with the present invention, for inspecting a substrate assembly and its matching heatsink hat assembly to determine mismatches between chips and pistons.

System 200 comprises two stages 211 and 251. Stage 211 supports a substrate assembly (214) to be inspected. Stage 251 supports a heatsink hat assembly (254) which is to be packaged with the substrate assembly (214). Both stages may be slidably moveable, so that the appropriate assembly may be placed on the stage and slide into place. Suitable means (not shown) such as a robot, human operator, or the like may be provided for transporting the assemblies to and from the stages. In practice, the stage may be as simple as a slidable drawer or platform or may be a more complex motorized stage with stage control achieved by a programmed controller, a joy stick, or the like.

System 200 further comprises two image-acquisition devices typically video or television cameras,—a substrate camera (214) and a heatsink hat camera (254), trained on the substrate (212) and heatsink hat (252), respectively. In practice, the optical axis of each camera is normal to the surface of its associated assembly. Further, each camera may be positioned on mounts which may be vertically and horizontally adjusted for focus. Commercially available cameras and mounts both may be used. In the embodiment illustrated in FIG. 4, the Panasonic WD50 video camera with a 17 mm. lens and adjustable focus and the Bauch & Lomb Stand MONO220M adjustable mount were used.

The slide, cameras and mounts are positioned with respect to each other so that the slide may carry the assembly within the viewing range of the appropriate camera. The camera mounts are chosen so that by adjusting them, the assemblies on the slides may be brought into camera focus.

System 200 further comprises two light sources or illuminators—a substrate light source (216) and a heatsink light source (256). Each light source is positioned so as to illuminate the associated assembly on the slide when it is within the viewing area of its camera.

For the substrate assembly, the light (216) is directed to the assembly through fiber optic leads (218) which extend from the light source (216) to a position which allows the light to be directed onto the substrate assembly (212). In the embodiment illustrated in FIG. 4, three divided fiber optic leads were used.

Figure 3A:
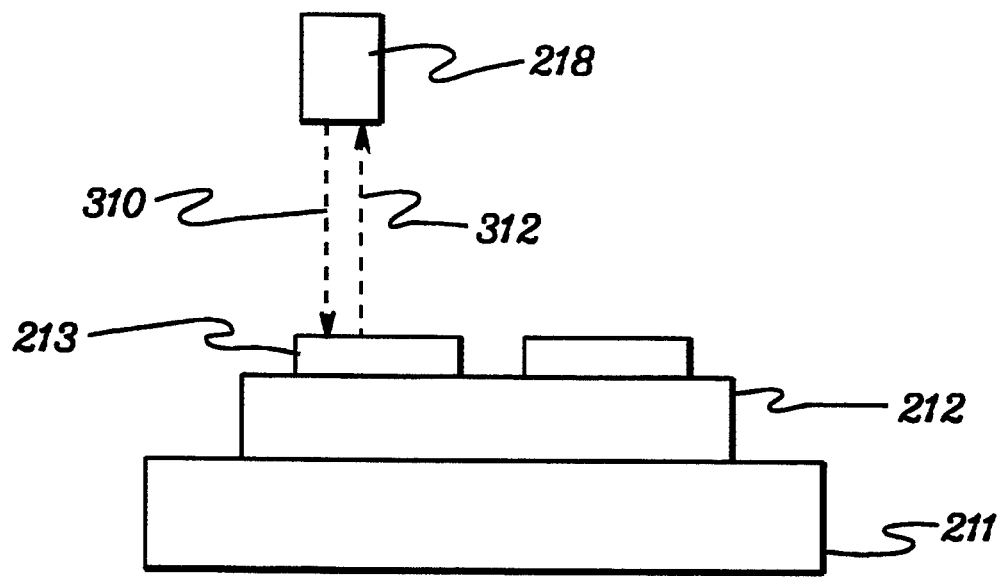
FIG. 3A and 3B are schematic illustrations of a detail of the system of FIG. 2.

The technique used to light the substrate is known as bright field illumination. This may be more clearly understood by referring to FIG. 3A which shows of detail of the slide (211), substrate assembly (212), chips on the assembly, and the emitting end of the fiber optic leads (218). In FIG. 3A, a beam (310) from the leads is directed at the surface of the substrate assembly which is normal to the plane of the beam. That portion of a beam (312) which strikes the generally planar, highly reflective surface of the chip will be reflected normally upward and into the camera (214) of FIG. 2. In contrast, the surface of the substrate is composed of ceramic or thin film. These substances have a more matt finish which tends to scatter light at various angles from the surface. When a blue diachroic filter is used, the substrate surface will appear white, in sharp contrast to the chip surfaces, which appear black.

Figure 3B:
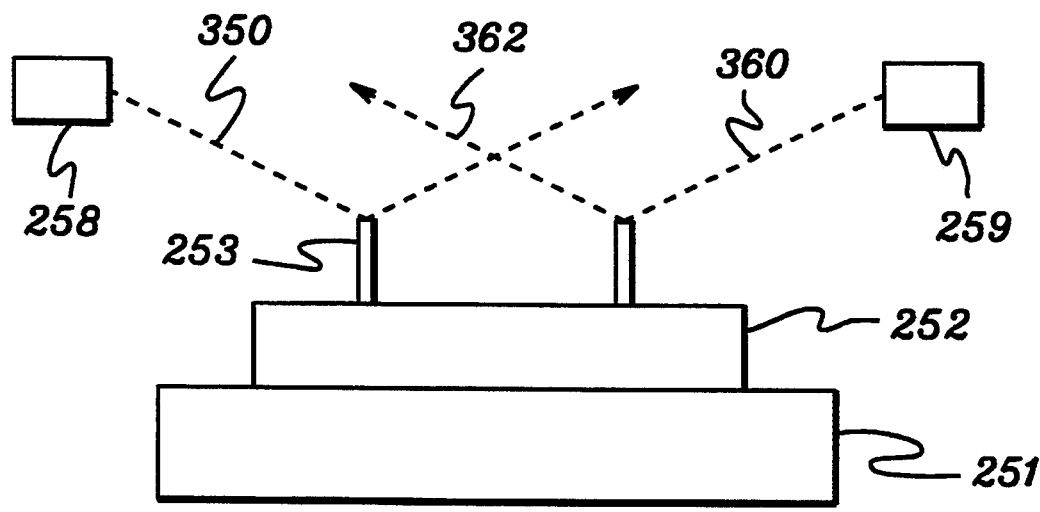

For the heatsink hat assembly, the light (256) is directed to the assembly through a plurality of fiber-optic leads, extending from the light source (256) to a position which allows the light to be directed onto the heatsink hat (252) assembly. To assist understanding of the invention, FIG. 3B shows a detail of the slide (251), substrate assembly (252), pistons on the assembly (253), and two of the emitting ends of the fiber optic leads (258 and 259). The emitting ends of the leads are positioned in a circular manner around a twelve inch diameter ring (260) which was angled slightly with respect to the planar surface of the heatsink assembly (252). In the embodiment defected by FIG. 4, eight leads were positioned about a twelve inch diameter ring (260) which was angled at approximately ten to fifteen degrees of the heatsink assembly plane.

Referring to FIG. 3B, beam 350 is directed at the surface of the assembly at an acute angle. Beam 352 is reflected vertically upward upon striking a upwardly protruding feature such as a piston (253). Were one of the beams to strike a generally planar reflective surface, (such as a missing piston), the beam would reflected away from the camera.)

Figure 4:
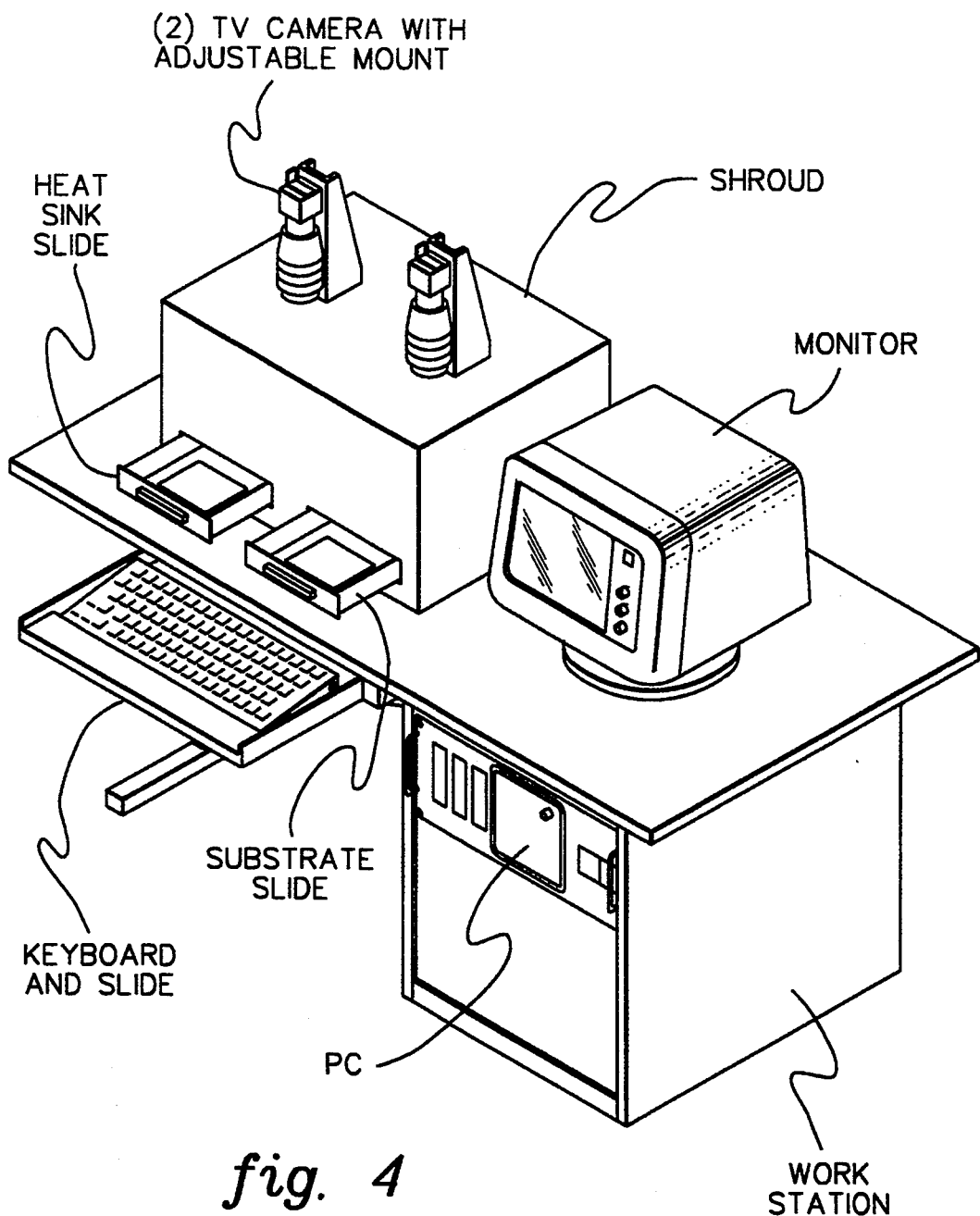
FIG. 4 is a pictorial representation of an embodiment of the invention.

Referring back to FIG. 2, the subsystem 210 (comprised of substrate camera, substrate assembly; slide and light source) is isolated so that no light other than that of the light source falls on the assembly. The same is true for subsystem 250. FIG. 4 shows one embodiment of the invention, in which this was accomplished by using a shroud comprised of two separate chambers. As seen in FIG. 4, the shroud (400) is substantially rectangular in shape and is separated into two chambers by an opaque vertical wall (410) which divides the shroud into two approximately equal chambers. The shroud was made of sheet metal, tightly seemed so as to eliminate outside light. (As will be known by those skilled in the art, any light opaque material of sufficient strength would be acceptable.) To further control the light, the interior sides of the shroud were coated black, thus eliminating stray reflections from the light sources, off the interior shroud walls, and back to the camera viewing area. In the present embodiment, this was done by the simple expedient of painting the inside of the shroud with a matte black paint suitable for sheet metal surfaces. The construction is such that no light from one chamber is capable of penetrating the other.

Each chamber of the shroud provides access to a camera (420 and 430) and contains a sliding drawer (440 and 450) and a light source (not shown). As illustrated by FIG. 4, in the present embodiment, the cameras (420 and 430), in their adjustable mounts, are positioned on the upper side of the shroud, with their lenses extending through holes in the upper side of the shroud.

Referring back to FIG. 2, in operation, the cameras 214 and 256 are used to obtain images of the substrate (212) and the heatsink hat (252), respectively. The substrate camera (214) is focused on all the chip sockets in the substrate array (in the present embodiment, a 10×10 array is used) and the heatsink hat camera (254) is focused to all cooling pistons (in the present embodiment, a corresponding 10×10 array).

Cameras 214 and 254 have their output coupled to a machine vision processor (260) whose purpose is to convert the visual images to formats which may be processed by a program. To achieve optimal results from such processing, images are preferably bileval—that is, the image consists of black objects on a white background or white objects on a black background. In the present embodiment, black objects on a white background were used. To achieve this result, the following light sources were used.

For the substrate, since the silicone top portion of the chip is a reflective mirror, the light source used is a an 80 watt quartz halogen bulb (such as those commercially available from General Electric). Because of the highly reflective nature of the chips, the light is filtered through a blue diachroic filter from Melles Griot or any other similar commercially available filter. The narrow wave bandwidth created by the blue diachroic filter reduces the light reflected from the chips surface, presenting a distinct black chip on a white background to the camera.

For the heatsink hat assembly, a ring annular light will present a round circle for each present piston and thus obtain the optimal bileval image. The present embodiment used an 80 watt quartz halogen bulb (such as is commercially available from General Electric) which is then carried through eight fiber-optic leads and directed against the heatsink assembly at an acute angle, as described above.

In the embodiment illustrated in FIG. 4, the machine vision processor was comprised an IBM personal computer, AT (registered trademark of International Business Machines Corporation), with a 386 Intel board, a 387 math co-processor, and three megabytes of memory. The operating system used was DOS 5.0.

During operation, the image of the substrate and the heatsink is sent, in real time, to a video monitor for image adjustments by an operator. The live video image is displayed to the operator with four white crosses superimposed on the image. The operator sets the correct image size and position by aligning the corner pistons on the heatsink (or chip-sites on the substrate) with the white crosses. Periodically (or as required), the operator may also adjust focus and lighting level.

The images from the cameras are also sent to a frame grabber card in the AT. Frame grabber cards are commercially available. The card used in the embodiment illustrated in FIG. 4 was the Data Translation Card, Model DT2851. The frame grabber card takes the received signals and stores the each camera image as an array of image points. Each cell in the array contains an integer value corresponding to the brightness of that point in the image.

The image arrays of the substrate and heatsink hat are passed to an application program in the personal computer. For the substrate image, the application program determines if a chip is present at each possible chip location on the substrate by summing the brightness levels at each possible chip location and checking the sum against some pre-established minimum value (or decision threshold). The pattern of the actual chip population is then stored in memory.

Using a similar technique, the presence of pistons at their possible location and the pattern of the actual piston population on the heatsink hat is determined.

The population patterns of the substrate and hat are then compared and any discrepancies are reported in graphical and/or textual formats to the operator. On the video monitor, "X"s are superimposed on the substrate and heatsink image in the locations of the discrepancy. An error report is also sent to the computer screen in textual format.

A more detailed description of the program follows.

Figure 5A:
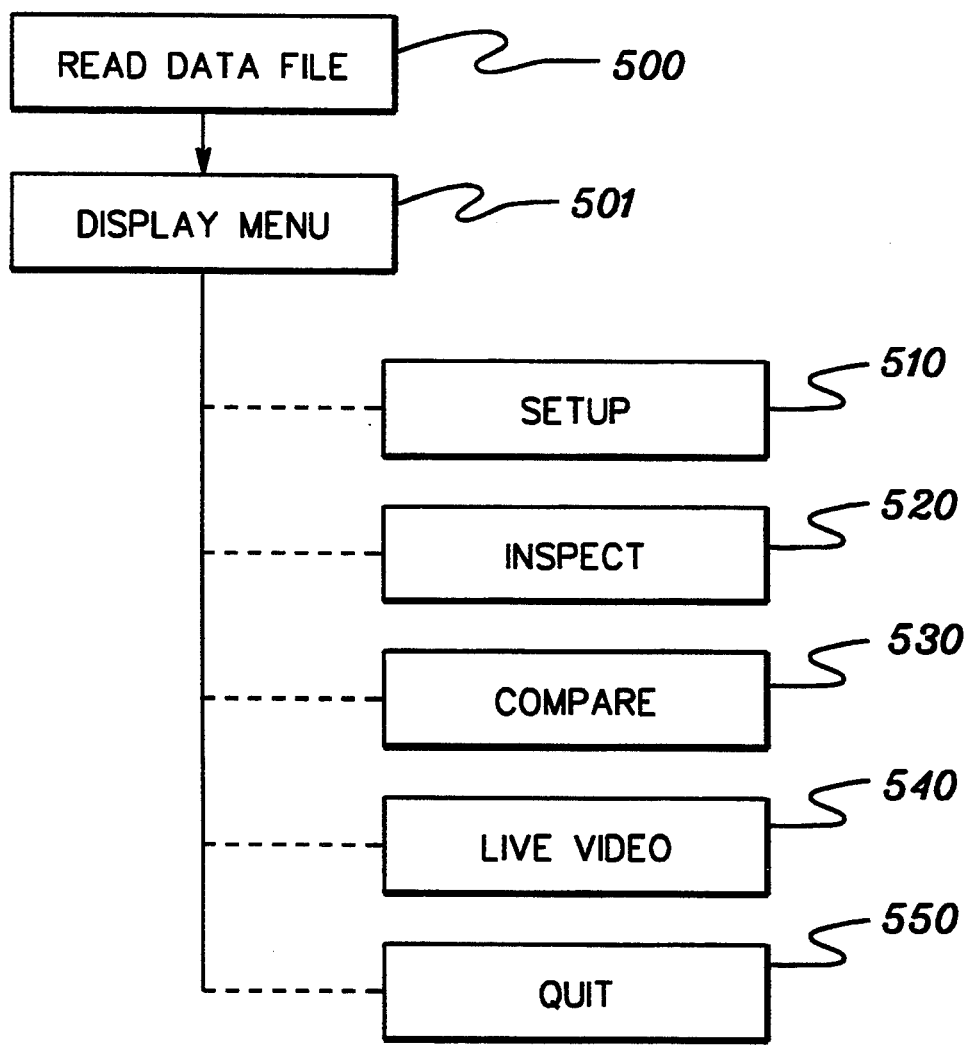
FIG. 5A is a flow diagram of the program executed by the system of FIG. 2 to determine mismatches.

FIG. 5A shows a flow diagram for the program instructions. In Step 500, a pre-existing file, containing information on the layout of both the substrate and heatsink hat assemblies, such as the row/column locations and dimensions of the chips and pistons.

Figure 5B:
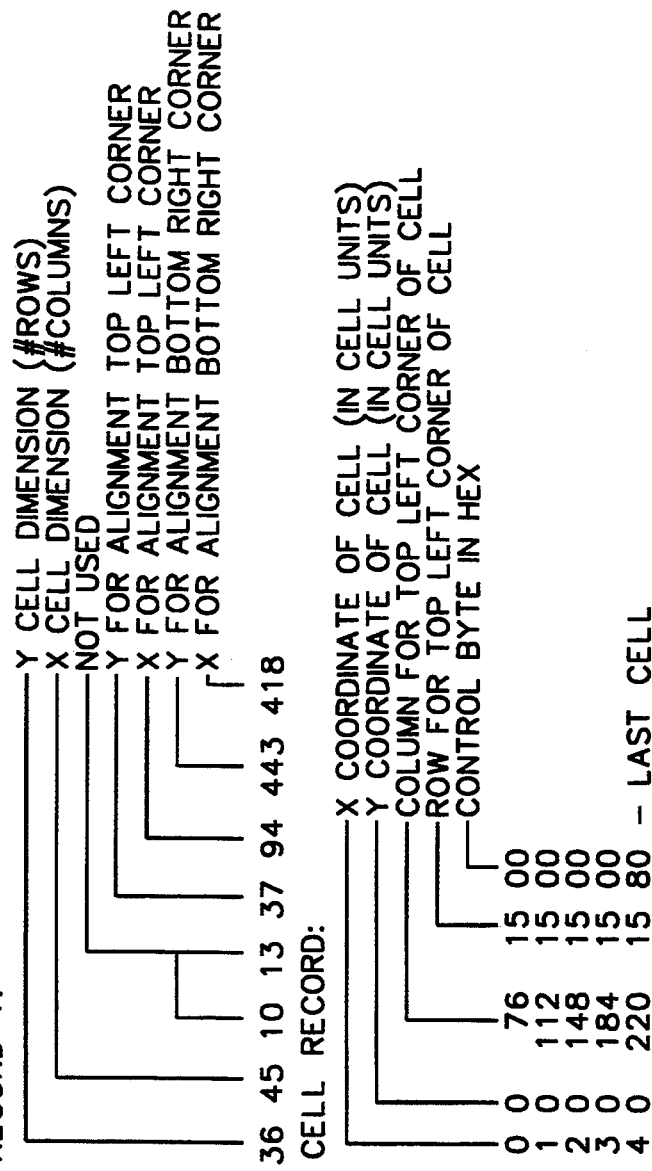
FIG. 5B is a representation of the record layout used in the program.

FIG. 5B shows an example of a format for the file. In that figure, the file consists of Record 1 (600) with eight fields. The fields of Record 1 contain the following information:
  the number of rows and columns of the arrays to be compared, and
  the x,y coordinates of the top left corner and the x,y coordinates of the bottom right corner for use in alignment of the two assemblies.

Record 1 (600) followed by a Cell Record (610) for each cell or position unit in the array. (This corresponds to the number of chips or pistons) The cell record has four fields: the x,y coordinate of the cell in cell units, and the column and row for the top left corner of the cell.

Returning to FIG. 5A, Step 501 of the flow diagram is the display of a menu, whereby the operator can select the next action to be taken. These choice of actions is comprised of: Step 510—Setup; Step 520—Inspect; Step 530—Compare; and Step 540—Live Video; and Step 550—Quit. These steps are described in more detail in the following paragraphs.

Figure 1:
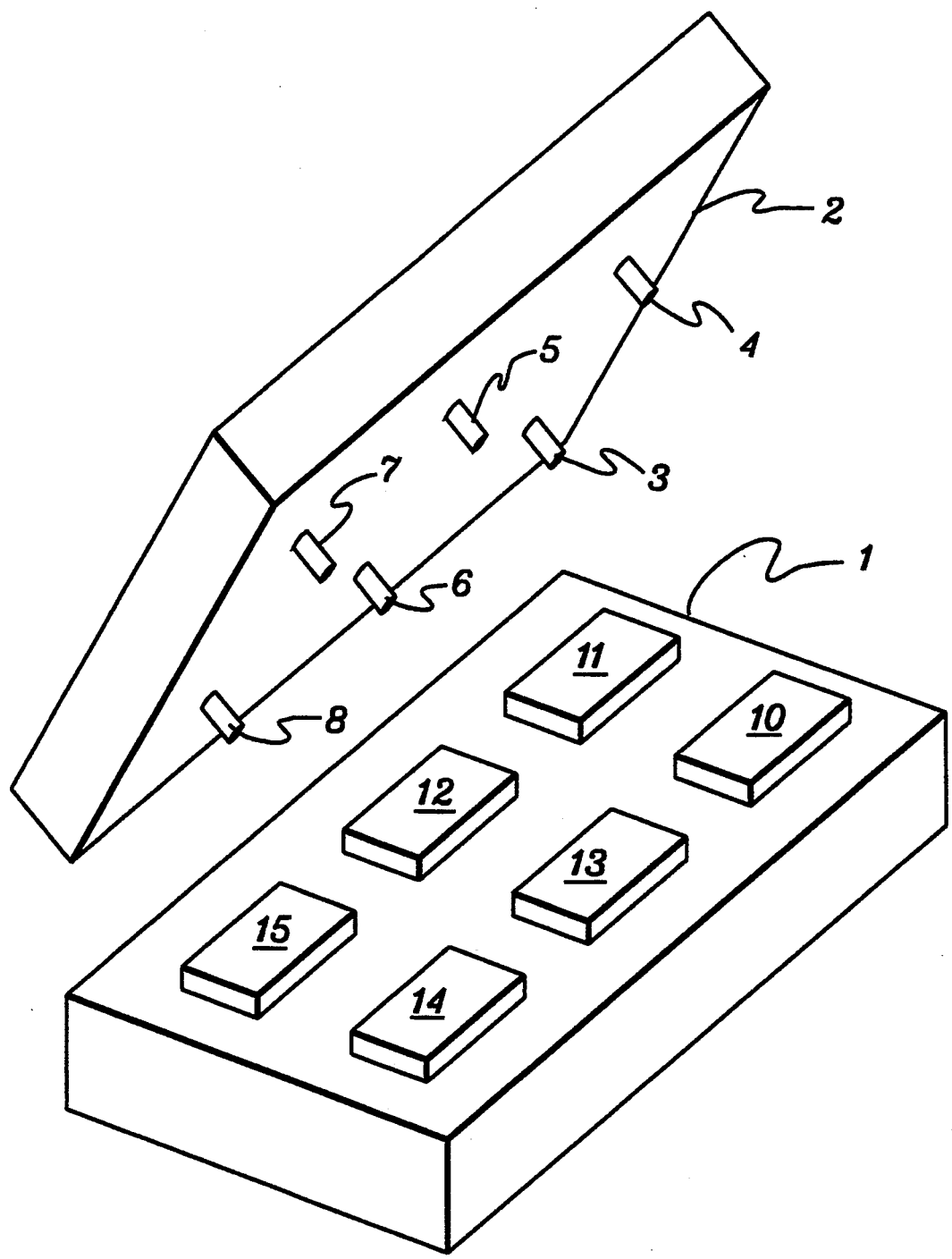
FIG. 1 is a perspective drawing of a substrate assembly with six chips and a heatsink hat assembly with six pistons).

In Step 510, Setup, an alignment box (consisting of four "X"s marking the corners of a square) is displayed on monitor 280 of FIG. 1 so that the operator can ensure that the assemblies are correctly placed. (That is, the operator displays an image of an assembly from each of the cameras, in turn: each corner of the assembly is aligned with one of the "X"s. During this step, the operator is also prompted for, and enters in, the detection threshold: that is, the percentage of white pixels above which it will be determined that a chip or piston is missing. This value is stored in the global variable THRESH. (The structure of the variable THRESH is described in TABLE A.) As a final phase of this step, the lookup table may be interactively modified to binarize the image at the desired threshold. More precisely, the image from each camera is composed of pixels which will be represented in the processor as an integer between 0 and 255. Since the program requires a bilevel image, that is, one whose pixels are either 0 or 255 (black or white), the operator must chose a constant. All pixel values below this constant will be converted to 0; all pixel values above this constant will be converted to 255.

Figure 5C:
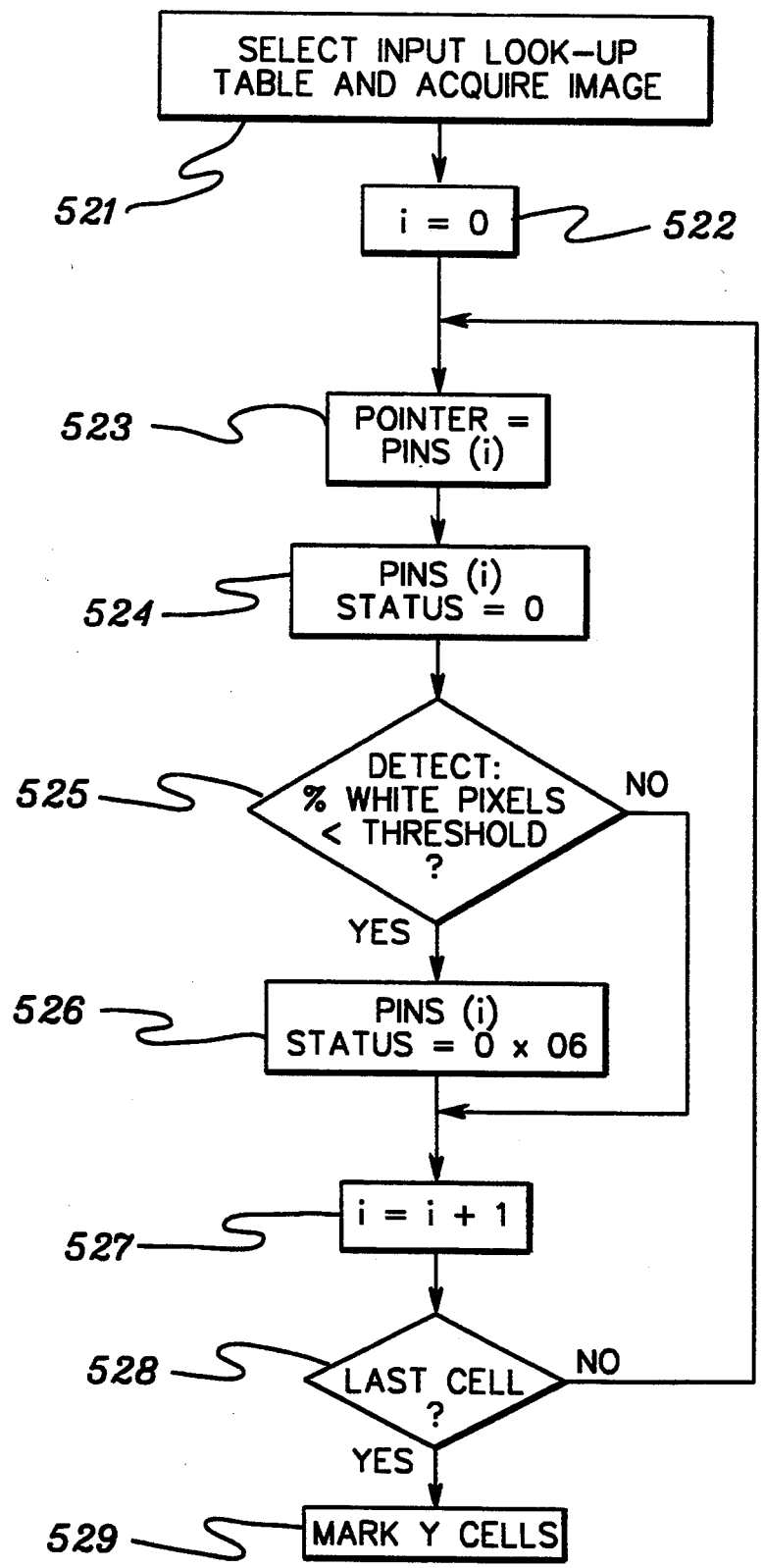
FIG. 5C is a detail flow diagram of the insert step of the program of FIG. 5A.

Step 520, Inspect, is shown in more detail in FIG. 5C. In Step 521, an input look-up table (previously created under Setup, Step 530) is selected and a bilevel image is of an assembly is acquired.

In Step 522, a counter is set to zero. Step 523 selects the variable from a sequential series of variables (referred to as a pin) which corresponds to the counter setting. This variable is part of an array which has one element corresponding to each chip expected to be on the substrate (or each piston expected to be on the heatsink hat). Each element identifies the expected location (the cell) of the chip or piston in the image. TABLE A provides a detailed layout of the elements of the array.

In Step 524, the status of the selected pin is set to zero. In step 525, using the array, the program identifies those pixels which belong to a cell which corresponds to a pin. The percentage of white pixels the cell is determined and stored. That percentage is compared to the threshold number contained in the global variable THRESH. If the percentage is above the threshold, the counter is incremented by one (Step 527). If the percentage is below the threshold, the status of the pin is set to indicate this fact. In Step 526, the status is set to 0×06. The counter is incremented by one (Step 527) and the process is repeated until all the cells have been reviewed.

Returning to FIG. 5A, Step 530 compares the output created by applying Step 520, inspect, against a substrate assembly and against a heatsink hat assembly.

Step 540 allows the operator to monitor the process by routing the video output of the cameras to the monitor (280 of FIG. 1). Step 550 allows the operator to quit the program.

The above described program may be written in any conventional program language for execution on the machine vision processor, as described above, or on a host computer in a distributed processing system of which said machine vision processor is a part. Further, it is within the scope of the invention that some of the steps in the flow diagram of FIG. 5 can be placed in a different order or otherwise modified without departing from the spirit of the invention.

The above described invention has a number of advantages. First, the detection threshold may be changed, either by manual input into the program or automatically, to account for variations in lighting conditions or specific optical characteristics of the assemblies being inspected.

Another advantage is that, since the comparison is done by a program, to inspect differing substrate size and/or population patterns all that is needed is a pre-established set of alternate configurations maintained in a file. Thus, for example, the apparatus could be modified to inspect 11×11 chip patterns by modifying the program, without any camera adjustment.

Still another advantage is that the population patterns could also be compared to theoretical patterns where the theoretical patterns were previously input into the program.

While the present technique has been described with respect to inspecting a substrate assembly and heatsink hat assembly to identify any mismatch between the chips of the former and the pistons of the later, it is equally useful for gauging alignment of pins on an integrated circuit package with corresponding holes in a printed circuit board or other similar tooling which requires the assemblies to have matching parts.

It is to be understood that the above-described embodiments are merely illustrative of the principles of the invention. Various modifications and changes may be made thereto by those skilled in the art which will embody the principles of the invention and all within the spirit and scope thereof. For example, in FIG. 4, the shroud, with its cameras and slides, the personal computer and the monitor were all housed in a single work station. Other configurations are also possible. In another alternative embodiment, output from the substrate population detection step could be used as input to an automated tool to populate the heatsink hat with pistons.

We claim:

1. A method for inspecting two articles to detect mismatches between the topographical features on each of their surfaces, comprising the steps of:
   illuminating a surface of a first article of a first type with a light;
   illuminating a surface of a second article of a second type with a light, said second type being different from said first type;
   capturing a first image of said surface of said first article;
   capturing a second image of said surface of said second article;
   converting said first image to a first array;
   converting said second image to a second array;
   comparing said first array to a first expected topography;
   comparing said second array to a second expected topography;
   identifying mismatches between said first array and said first expected topography and said second array and said second expected topography;
   notifying an operator of said identified mismatches.

2. A method according to claim 1 wherein said illumination creates a bilevel first image and a bilevel second image.

3. A method according to claim 1 wherein said first array of said first image is comprised of a matrix of cells, each cell containing an integer value corresponding to the brightness of a corresponding point of said first image.

4. A method for inspecting two articles to detect mismatches between the topographical features on each of their surfaces, comprising the steps of:
   illuminating a surface of a first article with a first light source;
   illuminating a surface of a second article with a second light source;
   capturing a first image of said surface of said first article from light reflected off of said surface of said first article;
   capturing a second image of said surface of said second article from light reflected off of said surface of said second article;
   converting said first image to a first array;
   converting said second image to a second array;
   comparing said first array to a first expected topography;
   comparing said second array to a second expected topography, said second expected topography being different from said first expected topography; and
   identifying mismatches between said first array and said first expected topography and between said second array and said second expected topography.

5. A method according to claim 3 wherein said comparison is comprised of summing the brightness levels of identified cells and comparing said sum against a preestablished integer.

* * * * *